(12) United States Patent
Chang et al.

(10) Patent No.: US 11,374,174 B2
(45) Date of Patent: Jun. 28, 2022

(54) DEPOSITION MASK AND METHOD OF MANUFACTURING DISPLAY DEVICE USING THE SAME

(71) Applicant: Samsung Display Co. Ltd., Yongin-si (KR)

(72) Inventors: Moon Won Chang, Hwaseong-si (KR); Oh June Kwon, Hwaseong-si (KR); Soo Youn Kim, Siheung-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 16/861,350

(22) Filed: Apr. 29, 2020

(65) Prior Publication Data

US 2020/0259091 A1    Aug. 13, 2020

Related U.S. Application Data

(63) Continuation of application No. 16/122,977, filed on Sep. 6, 2018, now Pat. No. 10,651,385.

(30) Foreign Application Priority Data

Nov. 6, 2017    (KR) .......................... 10-2017-0146745

(51) Int. Cl.
| | |
|---|---|
| *H01L 51/00* | (2006.01) |
| *H01L 51/52* | (2006.01) |
| *H01L 51/56* | (2006.01) |
| *H01L 51/50* | (2006.01) |
| *H01L 27/32* | (2006.01) |

(52) U.S. Cl.
CPC ...... *H01L 51/0011* (2013.01); *H01L 51/5253* (2013.01); *H01L 51/56* (2013.01); *H01L 27/3241* (2013.01); *H01L 51/5012* (2013.01)

(58) Field of Classification Search
CPC ...................................................... H01L 51/00
See application file for complete search history.

(56) References Cited

FOREIGN PATENT DOCUMENTS

| | | |
|---|---|---|
| KR | 1020090068505 A | 6/2009 |
| KR | 1020120066493 A | 6/2012 |
| KR | 1020140081204 A | 7/2014 |
| KR | 1020160113422 A | 9/2016 |

*Primary Examiner* — Marvin Payen
(74) *Attorney, Agent, or Firm* — Cantor Colburn LLP

(57) ABSTRACT

A deposition mask includes: a plurality of sub-masks through which deposition material passes to a base layer to form a deposition layer defining a hole therein, each of the sub-masks including: an aperture through which the deposition material passes to the base layer, a total planar area of the aperture corresponding to less than a total planar area of the deposition layer, and a masking surface at which the deposition material does not pass through the sub-mask, the masking surface including a hole-forming portion of which a total planar area thereof corresponds to a total planar area of the hole defined in the deposition layer. The hole-forming portions of the sub-masks have a same shape and planar area as each other, and within each sub-mask, the shape of the hole-forming portion is nested within a shape of the aperture.

20 Claims, 13 Drawing Sheets

DEPOSITION MASK AND METHOD OF MANUFACTURING DISPLAY DEVICE USING THE SAME

This application is a continuation application of U.S. application Ser. No. 16/122,977 filed Sep. 6, 2018, which claims priority to Korean Patent Application No. 10-2017-0146745, filed on Nov. 6, 2017, and all the benefits accruing therefrom under 35 U.S.C. § 119, the disclosure of which in its entirety is incorporated by reference.

BACKGROUND

1. Field

The present disclosure relates to a deposition mask and a method of manufacturing a display device using the same.

2. Description of the Related Art

Among light-emitting display devices, organic light-emitting display devices have advantages in being self-emissive and having relatively wide viewing angle, good contrast ratio and fast response speed. For these reasons, organic light-emitting display devices are promising for a next generation display device.

A display panel of an organic light-emitting display includes a pixel-defining layer having an aperture to expose an anode electrode of a light emitting element disposed in each pixel. Within the light emitting element, an organic layer including an organic emissive material and a cathode electrode are disposed on the anode electrode exposed through the aperture of the pixel-defining layer.

The organic layer may further include at least one of a hole injecting layer, a hole transporting layer, an emissive layer, an electron transporting layer, and an electron injecting layer. Such an organic layer may be formed by deposition. For the deposition, a small mask scanning ("SMS") technique may be used, in which deposition is carried out while moving a substrate or a deposition source with a mask spaced apart from the substrate.

SUMMARY

Exemplary embodiments of the present disclosure provide a deposition mask capable of forming a deposition layer having an island-like hole defined therein, and a method of using the same.

Exemplary embodiments of the present disclosure also provide a method of manufacturing a display device without damaging an organic layer during a subsequent process of forming a penetration hole by laser processing.

These and other features, embodiments and advantages of the present disclosure will become immediately apparent to those of ordinary skill in the art upon review of the Detailed Description and Claims to follow.

According to an exemplary embodiment of the invention, there is provided a deposition mask. The deposition mask includes: a plurality of sub-masks through which deposition material passes to a base layer to form a deposition layer defining a hole therein, each of the sub-masks including: an aperture through which the deposition material passes to the base layer, a total planar area of the aperture corresponding to less than a total planar area of the deposition layer, and a masking surface at which the deposition material does not pass through the sub-mask, the masking surface including a hole-forming portion of which a total planar area thereof corresponds to a total planar area corresponding to the hole defined in the deposition layer. The hole-forming portions of the sub-masks have a same shape and planar area as each other, and within each sub-mask, the shape of the hole-forming portion is nested within a shape of the aperture.

In an exemplary embodiment, the number of the plurality of sub-masks may be two or three.

In an exemplary embodiment, the apertures of the sub-masks may have different shapes and/or sizes from each other.

In an exemplary embodiment, each of the sub-masks may further include a semi-transparent portion surrounded by the masking surface, the aperture and the hole-forming portion. The semi-transparent portion may have a plurality of holes or slits defined therein.

In an exemplary embodiment, the semi-transparent portions of the sub-masks may have a substantially same shape and size as each other.

According to an exemplary embodiment of the invention, there is provided a method of using a deposition mask. The method includes: providing a sub-mask of the deposition mask through which deposition material passes to a base layer to form a deposition layer defining a hole therein, the sub-mask including: an aperture through which the deposition material passes through the sub-mask to the base layer to form less than a total planar area of the deposition layer, and a masking surface at which the deposition material does not pass through the sub-mask, the masking surface including a hole-forming portion of which a shape thereof is nested within a shape of the aperture, and providing the deposition material to a same base layer, through a plural number of the sub-mask, to form on the same base layer the total planar area of the deposition layer.

In an exemplary embodiment, the hole in the deposition layer may correspond to the hole-forming portion in shape and size.

In an exemplary embodiment, the hole-forming portions of the plurality of sub-masks may have a substantially same shape and size as each other.

In an exemplary embodiment, a sum of planar areas of the apertures of the sub-masks may be substantially equal to the total planar area of the deposition layer in a top plan view.

In an exemplary embodiment, the total planar area of the deposition layer may be a product of a total planar area of the aperture of the sub-mask and the plural number of the sub-mask through which the deposition material is provided to the same base layer.

In an exemplary embodiment, the providing the deposition material through the plural number of the sub-mask may include aligning the sub-masks on the same base layer to dispose the apertures of the sub-masks non-overlapping with each other.

In an exemplary embodiment, the providing the deposition material through the plural number of the sub-mask may include aligning the sub-masks on the same base layer to dispose the hole-forming portions of the sub-masks completely overlapping with each other.

In an exemplary embodiment, the sub-mask may further include a semi-transparent portion adjacent to the aperture, and within the semi-transparent portion, a plurality of openings may be defined.

In an exemplary embodiment, the semi-transparent portions of the sub-masks may have a substantially same shape and size as each other.

According to an exemplary embodiment of the invention, there is provided a method of manufacturing a display device. The method includes: depositing an organic layer on a base substrate of the display device by using a deposition mask, the organic layer including an organic luminescent material and defining a hole therein; forming an encapsulation layer on the organic layer; and forming a penetration hole into which a device external to the display device is inserted, by removing a portion of the base substrate, the organic layer and the encapsulation layer. The penetration hole is formed inside the hole defined in the organic layer.

In an exemplary embodiment, the depositing the organic layer may include depositing the organic layer on a same base substrate by providing an organic layer material to the same base substrate, through a plural number of sub-masks of the deposition mask, to form on the same base substrate a total planar area of the organic layer.

In an exemplary embodiment, each sub-mask may include: an aperture through which the organic layer material passes through the deposition mask to the same base substrate to form less than the total planar area of the organic layer, and a masking surface at which the organic layer material does not pass through the deposition mask, the masking surface including a hole-forming portion of which a shape thereof is nested within a shape of the aperture.

In an exemplary embodiment, the hole in the organic layer may correspond to the hole-forming portion in shape and size.

In an exemplary embodiment, the display device may further include an insulating layer between the base substrate and the organic layer. The insulating layer and the encapsulation layer may include an inorganic material. The removing the portions of the base substrate, the organic layer and the encapsulation layer may further remove a portion of the insulating layer between the base substrate and the organic layer, at a position corresponding to the penetration hole.

In an exemplary embodiment, in the forming the penetration hole, the portions of the base substrate, the organic layer and the encapsulation layer may be removed by using a laser.

According to exemplary embodiments of the present disclosure, at least following effects can be achieved:

A deposition layer having an island-like hole defined therein can be formed by using a deposition mask.

By manufacturing a display device by using the deposition mask, it is possible to avoid exposure of an organic layer to outside the display device during a process of forming a penetration hole in the display device by laser processing, thereby reducing or effectively preventing damage to elements in the display device.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the present disclosure will become more apparent by describing in detail exemplary embodiments thereof with reference to the attached drawings, in which:

FIGS. 8A, 9A, 10A, 11A, 12A and 13A are top plan views while

DETAILED DESCRIPTION

Figure 1:
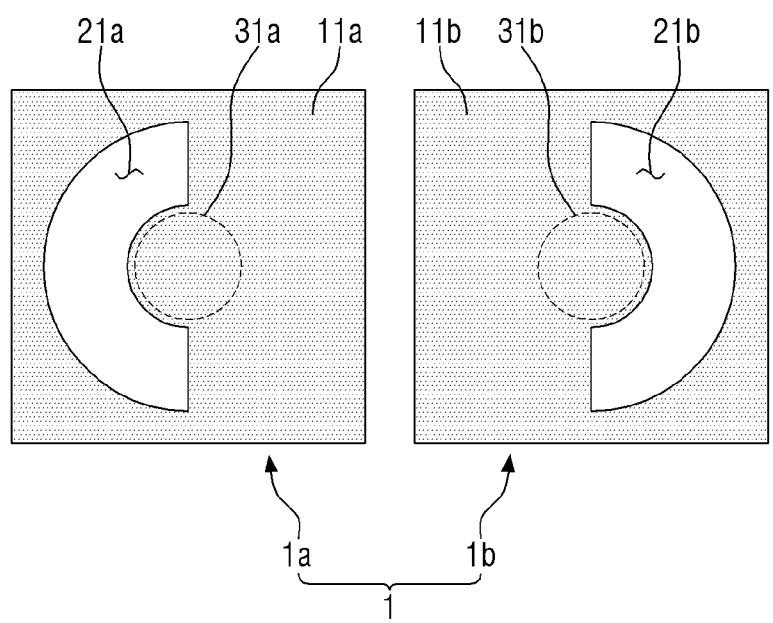
FIG. 1 is a top plan view of an exemplary embodiment of a deposition mask according to the invention.

Features of the invention and methods of accomplishing the same may be understood more readily by reference to the following detailed description of exemplary embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims.

It will be understood that when an element or layer is referred to as being related to another element such as being "on," "connected to" or "coupled to" another element or layer, the element or layer can be directly on, connected or coupled to another element or layer or intervening elements or layers may be present therebetween. In contrast, when an element is referred to as being related to another element such as being "directly on," "directly connected to" or "directly coupled to" another element or layer, there are no intervening elements or layers present. As used herein, the term "connected" may refer to elements being physically, electrically and/or fluidly connected to each other.

Like numbers refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof "At least one" is not to be construed as limiting "a" or "an." "Or" means "and/or." As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In order to expose a camera module in an active area of an organic light-emitting display panel, studies are on-going to form a penetration hole in the active area of the organic light-emitting display panel such as by laser processing. In forming the penetration hole, side surfaces of an organic layer, are directly exposed to outside the organic light-emitting display panel. Accordingly outside air, moisture and the like may be undesirably introduced to the exposed organic layer.

As an alternative approach in forming a penetration hole in the active area of the organic light-emitting display panel, an organic material layer for forming an organic layer may be deposited to form an organic layer having a penetration hole defined therein. However, forming an island-like masking surface with a single deposition mask may be difficult. As an island-like shape, the penetration hole may be considered an enclosed opening formed by portions of the organic material layer.

Hereinafter, exemplary embodiments of the present disclosure will be described with reference to the accompanying drawings.

FIG. 1 is a top plan view of an exemplary embodiment of a deposition mask 1 according to the invention.

Referring to FIG. 1, the deposition mask 1 may include of a plurality of sub-masks 1a and 1b. In the example shown in FIG. 1, the deposition mask 1 includes two sub-masks 1a and 1b. It is, however, to be understood that this is merely illustrative. The deposition mask 1 may include three sub-masks 5a, 5b and 5c as described later (refer to FIG. 6), or may include four or more sub-masks.

The sub-masks 1a and 1b may include masking surfaces 11a and 11b and apertures 21a and 21b, respectively. That is, the first sub-mask 1a may include a first masking surface 11a and a first aperture 21a, and the second sub-mask 1b may include a second masking surface 11b and a second aperture 21b. The mask 1 and portions thereof are disposed in a plane defined by first and second directions crossing each other (e.g., horizontal and vertical in FIG. 1). A thickness of the mask 1 and portions thereof are extended along a third direction which crosses each of the first and second directions.

Each of the apertures 21a and 21b may be defined in and/or by the respective masking surfaces 11a and 11b in a predetermined shape by penetrating the masking surfaces 11a and 11b. Each of the apertures 21a and 21b may be defined in an island pattern in the respective masking surfaces 11a and 11b. As being an island pattern, the apertures 21a and 21b are enclosed openings defined by portions of the sub-masks 1a and 1b at the masking surfaces 11a and 11b, respectively.

Each of the apertures 21a and 21b shown in FIG. 1 has a substantially semicircular shape, but this is not limiting. The apertures may have a square shape or a fan shape as will be described later. The specific shape thereof may be variously modified as desired. In addition, the number of the apertures defined in each of the sub-masks 1a and 1b is not limited to one. In an exemplary embodiment, the number of apertures in each of the sub-masks 1a and 1b may be equal to or more than the number of pixels of a display device for which layers thereof are formed using the sub-masks 1a and 1b of the mask 1.

The apertures 21a and 21b may have, but is not limited to, the same shape and size as each other within the mask 1.

The masking surfaces 11a and 11b may block a deposition material from passing through the sub-masks 1a and 1b, so that no deposition layer is formed under the masking surfaces 11a and 11b. The apertures 21a and 21b may allow a deposition material to pass therethrough so that the deposition layer is formed at locations corresponding to the apertures 21a and 21b.

The sub-masks 1a and 1b at the masking surfaces 11a and 11b thereof are solid portions of a material forming the sub-masks 1a and 1b, such that the deposition material does not pass therethrough at the masking surfaces 11a and 11b. The masking surfaces 11a and 11b of the sub-masks 1a and 1b may include and/or be made of, but not limited to, a metal material having a relatively high rigidity, for example, a metal such as stainless steel.

Each of the masking surfaces 11a and 11b may include hole-forming portions 31a and 31b, respectively. Each of the hole-forming portions 31a and 31b may be a portion of the respective masking surfaces 11a and 11b. A shape of the hole-forming portions 31a and 31b may be disposed as protruding into the respective apertures 21a and 21b. As "protruding into," a portion of the shape of the hole-forming portions 31a and 31b may be nested within that of the respective apertures 21a and 21b.

The hole-forming portions 31a and 31b of the respective sub-masks 1a and 1b may have the same shape and size as each other. In other words, the hole-forming portions 31a and 31b may have such a shape and a size that they can be completely overlapped and/or aligned with each other when the sub-masks 1a and 1b are disposed overlapped with each other.

When the sub-masks 1a and 1b are disposed overlapped with each other, the apertures 21a and 21b of the overlapping sub-masks 1a and 1b are connected to each other, so as to form a closed shape as an island-like pattern conforming to an overall shape of the hole-forming portions 31a and 31b. Specifically, in the example shown in FIG. 1, when the sub-masks 1a and 1b are disposed overlapped with each other, the shape of the first aperture 21a and the shape of the second aperture 21b come into contact with each other to form an overall circular shape having therein an island-like pattern (a circle pattern) conforming to the hole-forming portions 31a and 31b. The shape of the first aperture 21a and the shape of the second aperture 21b come into contact with each other at flat edge portions facing each other across the aligned hole-forming portions 31a and 31b. A more detailed description thereof will be given with reference to FIG. 2.

Figure 2:
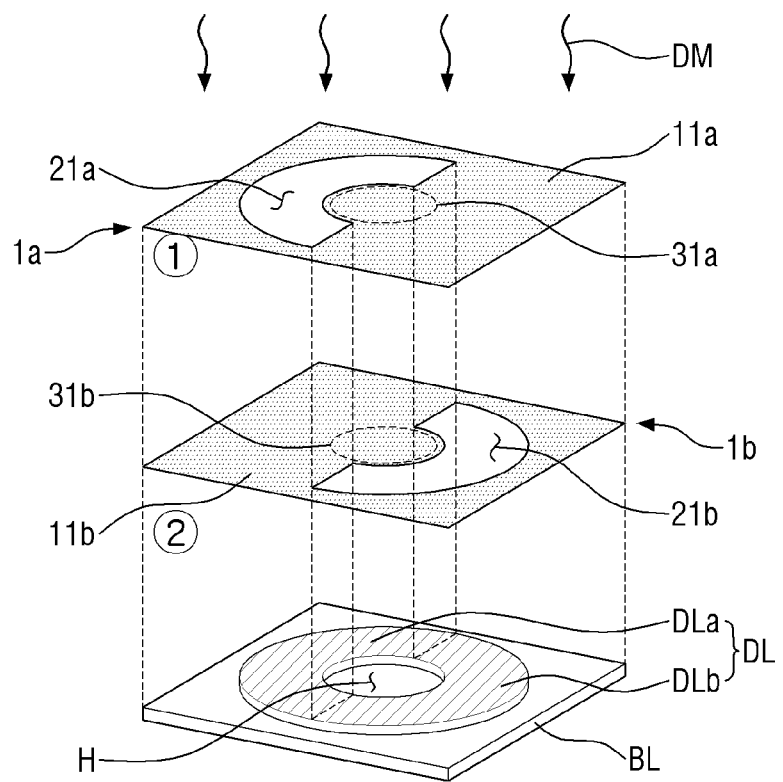
FIG. 2 is an exploded perspective view for illustrating an exemplary embodiment of forming a deposition layer having an island-like hole defined therein using the deposition mask according to the invention.

FIG. 2 is an exploded perspective view for illustrating an exemplary embodiment of forming a deposition layer DL having an island-like hole H defined therein using the deposition mask 1 according to the invention. A thickness of the mask 1, a base layer BL and layers thereon are defined in the vertical direction in FIG. 2.

Although FIG. 2 shows the example in which the deposition mask 1 shown in FIG. 1 is used as the deposition mask, it is to be understood that the shape or number of the deposition mask is not limited thereto.

Referring to FIG. 2, the deposition layer DL may be formed on a base layer BL by sequentially using the first sub-mask 1a and the second sub-mask 1b. Specifically, the first sub-mask 1a is placed on the base layer BL, and then a deposition material DM is provided to the base layer BL via the first sub-mask 1a. The deposition material DM passes through the first aperture 21a such that a first deposition layer DLa having the shape corresponding or identical to the first aperture 21a is formed on the base layer BL.

Subsequently, the second sub-mask 1b is placed on the base layer BL in place of the first sub-mask 1a, and then the deposition material DM is provided to the base layer BL via the second sub-mask 1b. The deposition material DM passes through the second aperture 21b such that a second deposition layer DLb having the shape corresponding or identical to the second aperture 21b is formed on the base layer BL, thereby forming a final deposition layer DL.

In doing so, the first sub-mask 1a and the second sub-mask 1b may be aligned with each other so that the apertures 21a and 21b do not overlap with each other while the hole-forming portions 31a and 31b completely overlap with each other. Accordingly, the final deposition layer DL may not be formed on a portion of the base layer BL that is covered by the hole-forming portions 31a and 31b. Finally, the deposition layer DL having an island-like hole H defined therein may be formed. That is, the deposition layer DL may be formed in the shape of a (discrete) closed shape having a hole (H) in an island pattern therein in the top plan view. Edges of the first and second deposition layers DLa and DLb (dotted line in FIG. 2) may contact each other, to form the final deposition layer DL as the discrete closed shape having the island-like hole H defined therein by portions of the final deposition layer DL.

In addition, the sum of planar areas of the apertures 21a and 21b may be substantially equal to a total planar area of the deposition layer DL in the top plan view.

According to the exemplary embodiment of the present disclosure, the deposition layer DL formed using the deposition mask 1 is formed not by performing deposition once, but by forming the first deposition layer DLa and forming the second deposition layer DLb in different operations from each other. Therefore, the first deposition layer DLa and the second deposition layer DLb may not be formed as a single piece at a single time, or may not be in contact with each other partially. Or, the first deposition layer DLa and the second deposition layer DLb may have different thicknesses.

In the foregoing description, the material deposition is carried out using the first sub-mask 1a and then the second sub-mask 1b. It is, however, to be understood that this is merely illustrative. The second sub-mask 1b may be used and then the first sub-mask 1a may be used. Alternatively, one of the sub-masks 1a and 1b may be used, and then the same one mask may be used such as by turning it over to align a respective aperture with an area at which a respective first or second deposition layer DLa or DLb is to be formed on the base layer BL.

If one of the sub-masks 1a and 1b is used several times, a product of the planar area of a respective aperture among the apertures 21a and 21b and the number of times such sub-mask is used, may be substantially equal to a total planar area of the final deposition layer DL. That is, a total planar area of the final deposition layer (DL in FIG. 2) may be a multiple of a total planar area of an aperture of an individual sub-mask, without being limited thereto.

Figure 3:
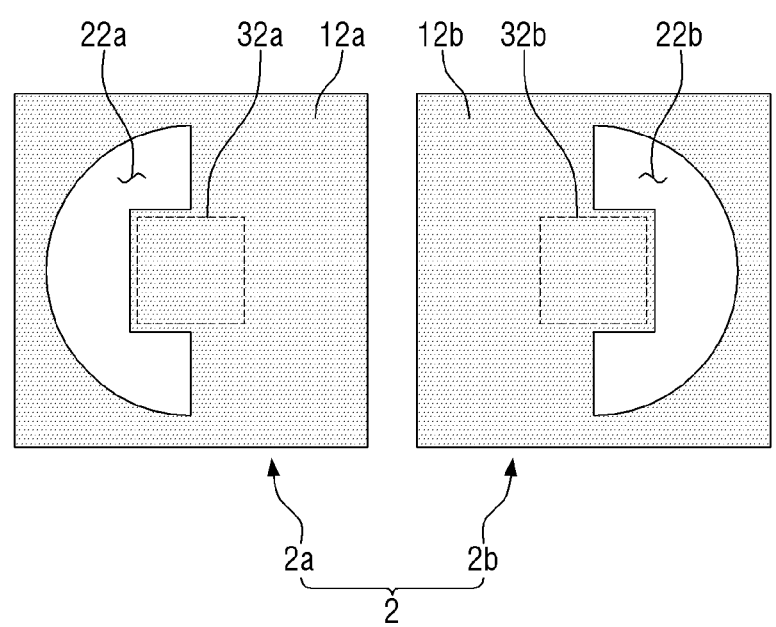
FIGS. 3 to 7 are top plan views of other exemplary embodiments of deposition masks according to the invention.
Figure 4:
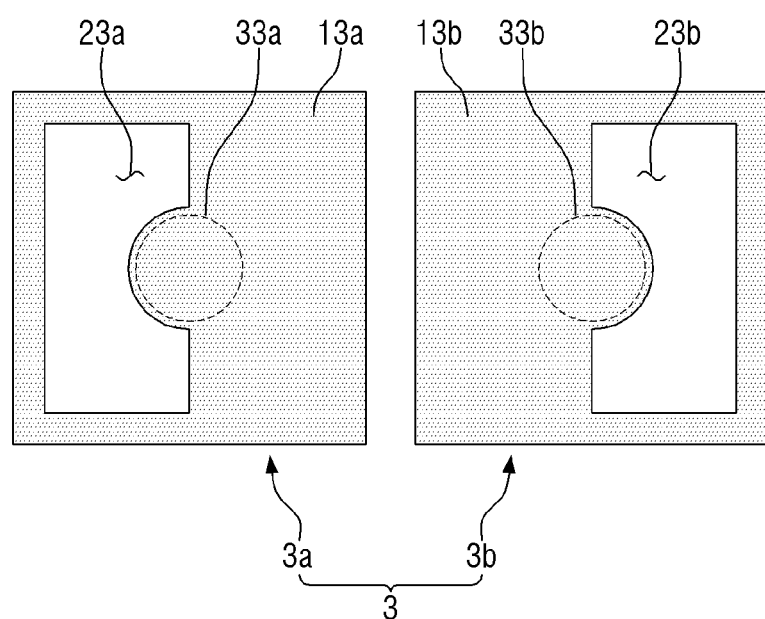

FIGS. 3 and 4 are top plan views of modified exemplary embodiments of deposition masks 2 and 3, respectively, according to the invention.

The deposition masks 2 and 3 of FIGS. 3 and 4 are identical to the deposition mask 1 of FIG. 1 except that the shapes of the hole-forming portions and/or the apertures are different from those of the deposition mask 1 of FIG. 1. Therefore, descriptions of the identical elements will not be made to avoid redundancy.

Referring to FIG. 3, the deposition mask 2 may include sub-masks 2a and 2b. The sub-masks 2a and 2b may include masking surfaces 12a and 12b and apertures 22a and 22b, respectively. Hole-forming portions 32a and 32b of the sub-masks 2a and 2b, respectively, may have a rectangular shape, unlike FIG. 1. It is to be noted that like in FIG. 1, the hole-forming portions 32a and 32b of FIG. 3 may have substantially the same shape and size as each other.

Referring to FIG. 4, the deposition mask 3 may include sub-masks 3a and 3b. The sub-masks 3a and 3b may include masking surfaces 13a and 13b, apertures 23a and 23b and hole-forming portions 33a and 33b, respectively. Each of the apertures 23a and 23b of the respective sub-masks 3a and 3b may have a substantially rectangular shape, unlike in FIG. 1. However, like FIG. 1, the apertures 23a and 23b of FIG. 4 may also together form a closed figure.

Figure 5:
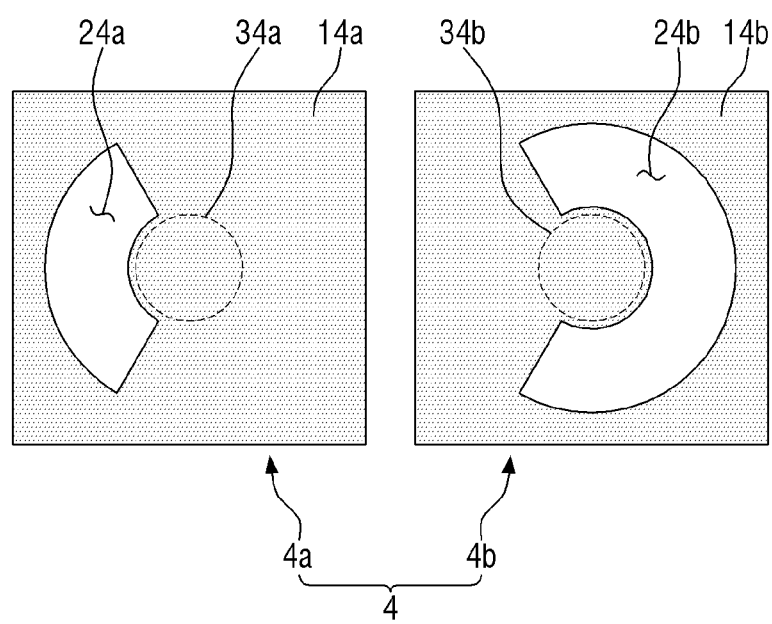

FIG. 5 is a top plan view of another exemplary embodiment of a deposition mask 4 according to another exemplary embodiment of the present disclosure.

The deposition mask 4 of FIG. 5 is identical to the deposition mask 1 of FIG. 1, except that the shapes of the first aperture 24a and the second aperture 24b are different. Therefore, descriptions of the identical elements will not be made to avoid redundancy.

Referring to FIG. 5, the first aperture 24a of the first sub-mask 4a may have a fan-shape whose center angle is smaller than 180°, while the second aperture 24b of the second sub-mask 4b may have a fan-shape whose central angle is greater than 180°. That is, the first aperture 24a and the second aperture 24b may have different shapes from each other. Although FIG. 5 shows that the first aperture 24a and the second aperture 24b have the fan-shapes, this is merely illustrative. The shapes of the first aperture 24a and the second aperture 24b are not particularly limited as long as they have different shapes or sizes from each other.

Although the first aperture 24a and the second aperture 24b in FIG. 5 have different shapes, they can be combined to form one closed figure like that of FIG. 1 and the like. Specifically, in the example shown in FIG. 5, the shape of the first aperture 24a and the shape of the second aperture 24b come into contact with each other to form an overall circular shape. That is, a total planar area of the first and second apertures 24a and 24b may correspond to a total planar area of the final deposition layer (DL in FIG. 2) formed using the mask 4.

Further, like FIG. 1, the hole-forming portions 34a and 34b as a portion of masking surfaces 14a and 14b of FIG. 5 may have substantially the same shape and size as each other.

Figure 6:
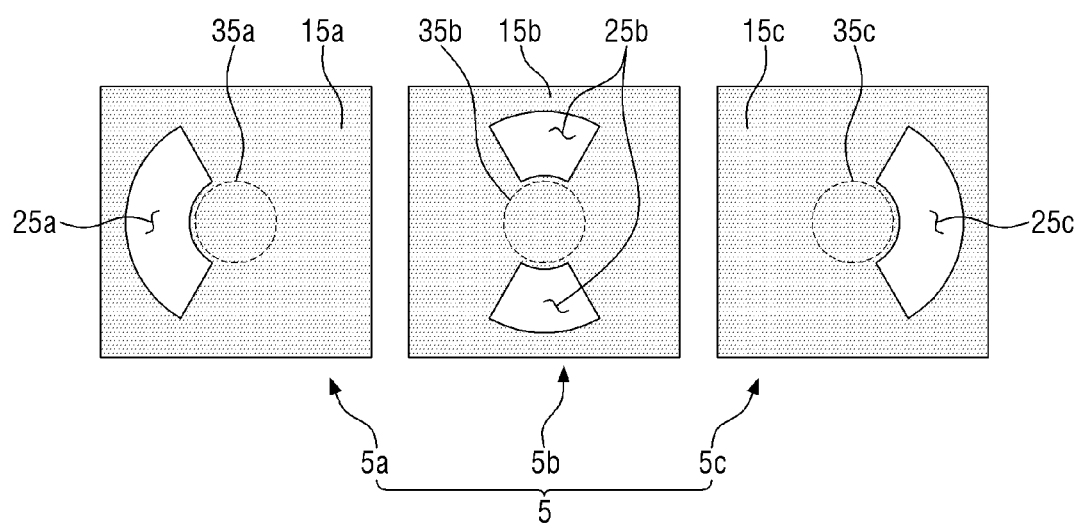

FIG. 6 is a top plan view of still another exemplary embodiment of a deposition mask 5 according to the invention.

The deposition mask 5 shown in FIG. 6 is identical to the deposition mask of FIG. 1 except that the deposition mask 5 includes three sub-masks 5a, 5b and 5c. The sub-masks 5a, 5b and 5c may include masking surfaces 15a, 15b and 15c and hole-forming portions 35a, 25b and 35c, respectively. Therefore, descriptions of the identical elements will not be made to avoid redundancy.

Referring to FIG. 6, the deposition mask 5 may include a first sub-mask 5a, a second sub-mask 5b and a third sub-mask 5c. The apertures 25a, 25b and 25c of the respective sub-masks 5a, 5b and 5c may be connected to one another when the sub-masks 5a, 5b and 5c are overlapped, to form a closed figure (for example, a circle).

The deposition mask DL of FIG. 2 may also be formed by sequentially using the sub-masks 5a, 5b and 5c of FIG. 6, like in FIG. 2 with the sub-masks 1a and 1b. The order of using the sub-masks 5a, 5b and 5b is not particularly limited herein. In addition, as shown in FIG. 6, if the aperture 25a of the first sub-mask 5a has the same size as the aperture 25c of the third sub-mask 5c, only one of the first sub-mask 5a and the third sub-mask 5c may be used, such as by repeating use of the third sub-mask 5c a number of times (e.g., by turning it over).

Figure 7:
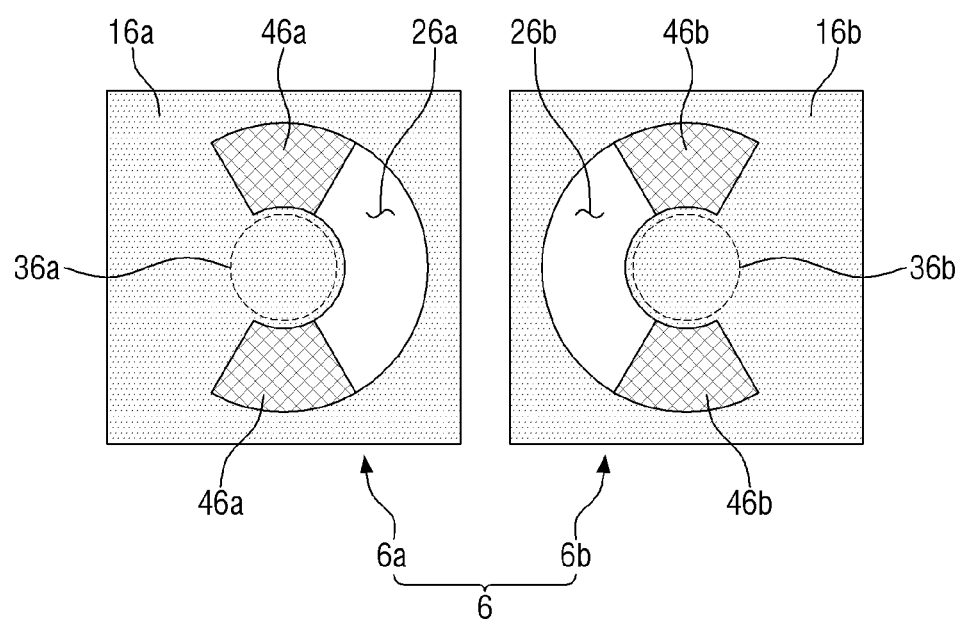

FIG. 7 is a top plan view of yet another exemplary embodiment of a deposition mask 6 according to the invention.

The deposition mask 6 shown in FIG. 7 is identical to the deposition mask 1 of FIG. 1, except that the deposition mask 6 further includes semi-transparent portions 46a and 46b. Therefore, descriptions of the identical elements will not be made to avoid redundancy.

Referring to FIG. 7, the sub-masks 6a and 6b may further include portions of semi-transparent portions 46a and 46b disposed adjacent to the apertures 26a and 26b, respectively. More specifically, the semi-transparent portions 46a and 46b may be surrounded by the masking surfaces 16a and 16b, the apertures 26a and 26b, and the hole-forming portions 36a and 36b, respectively.

The semi-transparent portions 46a and 46b may be formed of the same material as the masking surfaces 16a and 16b, with a plurality of fine holes or slits formed therethrough. That is, the semi-transparent portions 46a and 46b includes both solid portions and openings (holes or slits), such as forming a mesh or lattice-shaped structure. Accordingly, the semi-transparent portions 46a and 46b may transmit less deposition material therethrough than is transmitted through the apertures 26a and 26b.

The semi-transparent portions 46a and 46b of the sub-masks 6a and 6b, respectively, may have substantially the same shape and size as each other. When the deposition layer DL is formed using the deposition mask 6 of FIG. 7, the first sub-mask 6a and the second sub-mask 6b may be sequentially used, like those used in FIG. 2. In doing so, the first semi-transparent portion 46a of the first sub-mask 6a and the second semi-transparent portion 46b of the second sub-mask 6b are aligned with each other such that they completely overlap with each other. Accordingly, deposition material may be deposited twice at a same area of the base layer (BL in FIG. 2) which is under the semi-transparent portions 46a and 46b. A total thickness and/or density of the portion of the deposition layer DL that formed by twice-depositing deposition material at a same area of the base layer BL, using the semi-transparent portions 46a and 46b, may be similar to those of remaining portions of the deposition layer DL formed by once depositing deposition material through the apertures 26a and 26b.

FIGS. 8A, 9A, 10A, 11A, 12A and 13A are top plan views while FIGS. 8B, 9B, 10B, 11B, 12B and 13B are cross-sectional views for illustrating an exemplary embodiment of a method of manufacturing a display device 1000 by using the deposition mask 3 according to the invention. Specifically, FIGS. 8A to 13B show a method of forming a penetration hole PH in a layer of a display device 1000 via which an optical module such as a camera module or a sensor is exposed.

Specifically, the display device 1000 may be, but is not limited to, an organic light-emitting display panel including an organic layer 300.

Figure 8A:
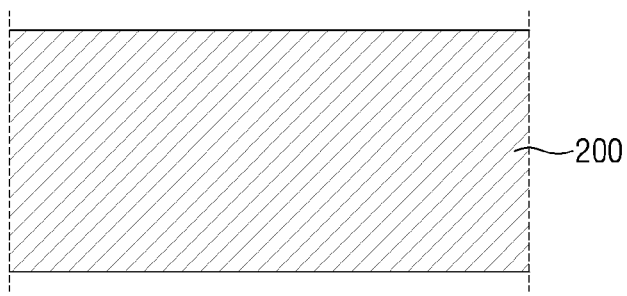
Figure 8B:
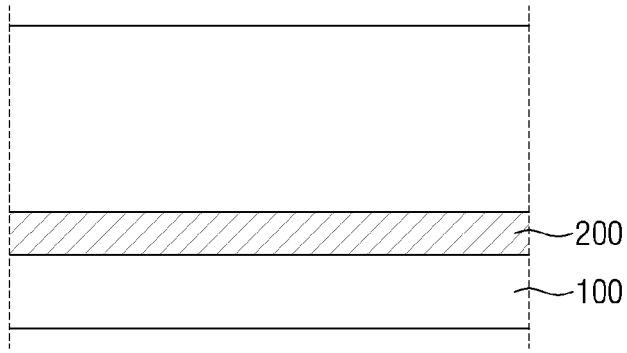
FIGS. 8B, 9B, 10B, 11B, 12B and 13B are corresponding cross-sectional views for illustrating an exemplary embodiment of a method of manufacturing a display device by using a deposition mask according to the invention.

Referring to FIGS. 8A and 8B, an insulating layer 200 of the display device 1000 is formed on a base substrate 100 thereof. The display device 1000 may include a switching element such as a thin-film transistor element (not shown) with which the display device 1000 is driven and/or controlled to display an image with light. Elements and layers of the thin-film transistor element may be disposed between the base substrate 100 and the insulating layer 200. The insulating layer 200 may be an inorganic insulating layer containing an inorganic material.

Figure 9A:
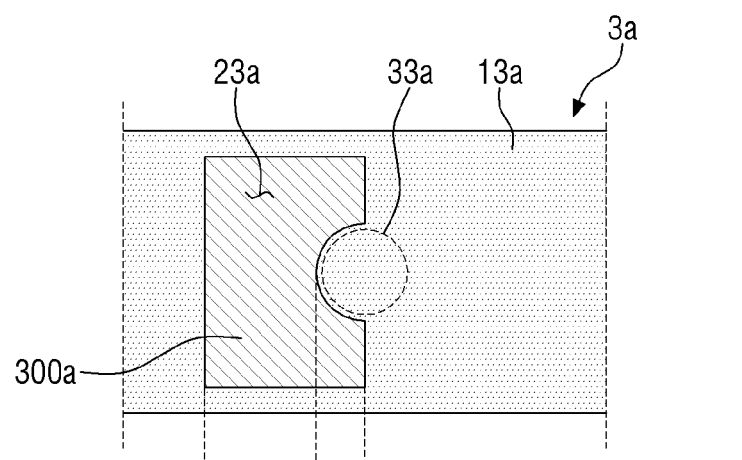
Figure 9B:
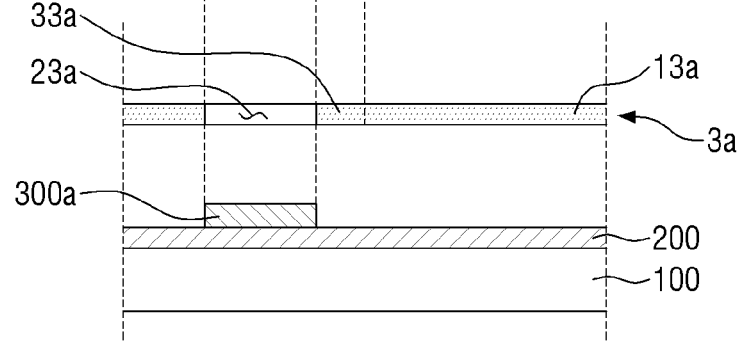
Figure 10A:
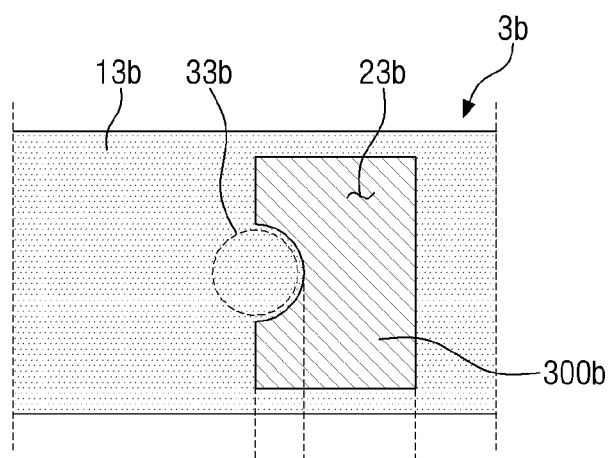
Figure 10B:
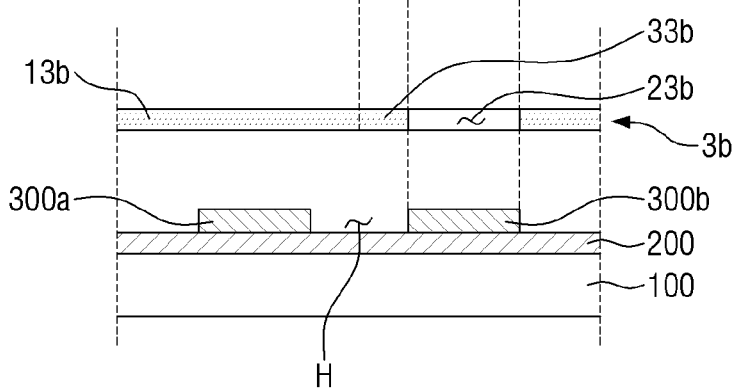

Referring to FIGS. 9A and 9B, a first organic layer 300a is deposited on the insulating layer 200 using a first sub-mask 3a. The first organic layer 300a is formed in a shape conforming to the first aperture 23a of the first sub-mask 3a. For convenience of illustration, the deposition mask 3 of FIG. 4 is used as an example.

Referring to FIGS. 10A and 10B and 11A and 11B, a second organic layer 300b is deposited on the insulating layer 200 using a second sub-mask 3b. The second organic layer 300b is disposed in a same layer of the display device 1000 as the first organic layer 300a, among layers disposed on the base substrate 100. As described above, positions of the first sub-mask 3a and the second sub-mask 3b are aligned with each other such that aperture 23a and the aperture 23b do not overlap with each other while the hole-forming portions 33a and 33b completely overlap with each other.

Figure 11A:
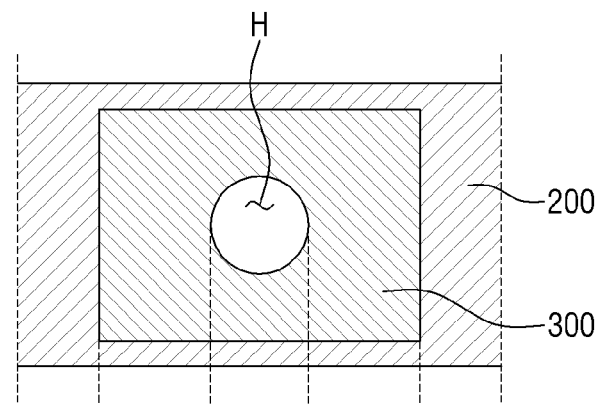
Figure 11B:
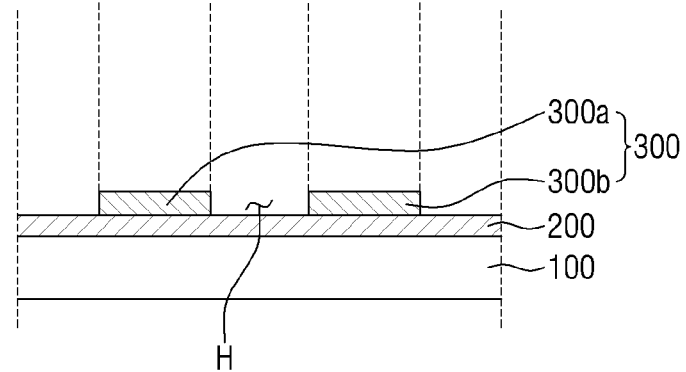

As a result, as shown in FIGS. 11A and 11B, an organic layer 300 having an island-like hole H defined therein may be formed by the first and second organic layers 300a and 300b. A shape of the hole H may conform to a collective shape of the hole-forming portions 33a and 33b, as defined between the apertures 23a and 23b.

The organic layer 300 may include an organic luminescent material. Although not shown in the drawings, the organic layer 300 may include multiple layers including one or more of a hole injection layer ("HIL"), a hole transport layer ("HTL"), an electron injection layer ("EIL") and an electron transport layer ("ETL").

In FIGS. 9A to 10B, the deposition is carried out using the first sub-mask 3a and then the second sub-mask 3b. It is, however, to be understood that the second sub-mask 3b may be used first and then the first sub-mask 3a may be used, as described above. Alternatively, only one of the sub-masks 3a and 3b may be used to form a first portion of the deposition layer, and then the same one sub-mask may be re-used such as by turning it over to align the aperture with an area of the base substrate 100 at which another portion of the deposition layer is to be formed.

Figure 12A:
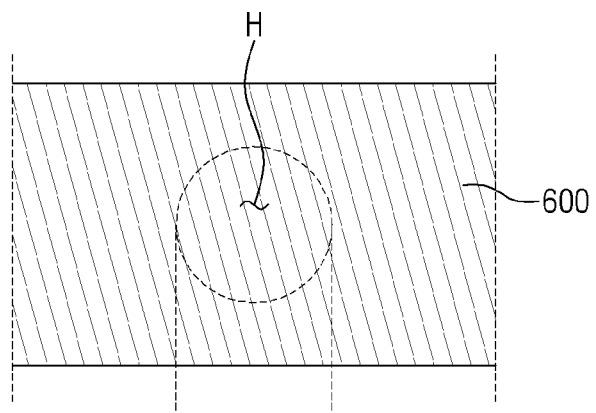
Figure 12B:
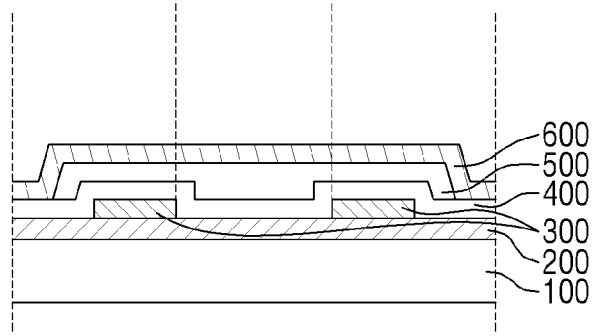

Referring to FIGS. 12A and 12B, an encapsulation layer 400 is formed to cover the organic layer 300, and sub-encapsulation layers 500 and 600 are formed to cover the encapsulation layer 400. The encapsulation layer 400 and the sub-encapsulation layers 500 and 600 may protect the organic layer 300 from outside air, moisture and the like. The sub-encapsulation layers 500 and 600 may include a first sub-encapsulation layer 500 and a second sub-encapsulation layer 600 which are sequentially stacked on the first sub-encapsulation layer 500. The encapsulation layer 400 and the second sub-encapsulation layer 600 may include an inorganic material, while the first sub-encapsulation layer 500 may include an organic material. It is to be understood that the materials of the encapsulation layer 400 and the sub-encapsulation layers 500 and 600 are not limited thereto. The layers 100 through 600 may be considered a structure of a display device 100 before a final penetration hole is formed.

Figure 13A:
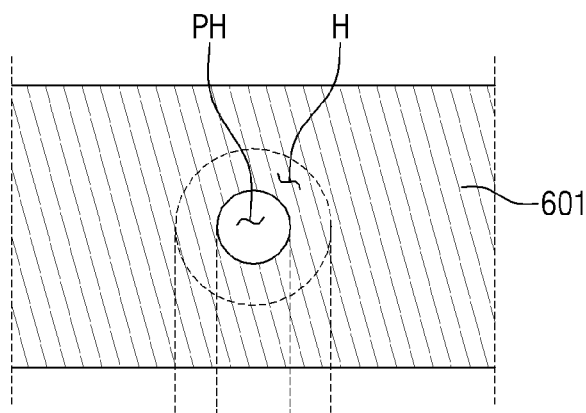
Figure 13B:
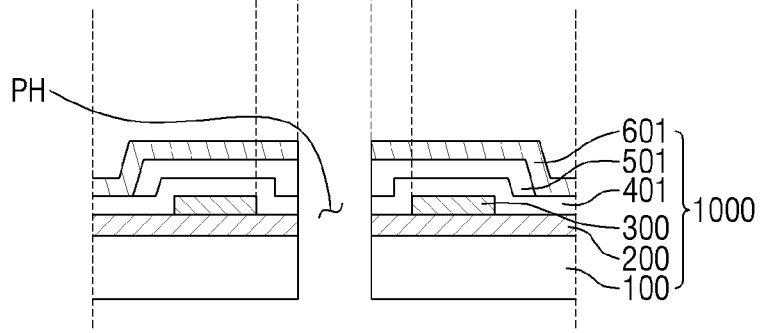

Referring to FIGS. 13A and 13B, a portion of the display device 1000 is removed to form a penetration hole PH. The penetration hole PH is extended from the base substrate 100 to the sub-encapsulation layers 500 and 600 of the display device 1000. An optical module such as a camera module or a sensor built in the display device 1000 may be exposed to outside the display device 1000 via the penetration hole. The penetration hole PH may be formed by removing a portion of the display device 1000, for example, by using laser.

The penetration hole PH may be formed inside the hole H defined in the organic layer 300. That is, the penetration hole PH may be included in the hole H in the organic layer 300 when viewed from the top. A maximum dimension of the penetration hole PH, such as along the first or second directions (e.g., horizontal in FIG. 13A and FIG. 13B), may be smaller than a minimum dimension of the hole H in the organic layer 300.

In a conventional method of manufacturing display device, if a portion of the display device 1000 is removed with laser without the hole H formed in the organic layer 300, the organic layer 300 may also be partially removed by the laser. As a result, side surfaces of the organic layer 300 may be exposed outside the display device 1000 at the hole H, so that elements of the display device 1000 as well as the organic layer 300 may be damaged by outside air, moisture or the like.

However, in one or more exemplary embodiment according to the invention, in the process of depositing an organic material and forming the organic layer 300 therefrom, the hole H is formed in the organic layer 300 in advance before portions of the display device 1000 are removed, such that the hole H of the organic layer 300 is larger than the penetration hole PH formed by removing the portions of the display device 1000. Accordingly, removal of a portion of the organic layer 300 in a subsequent laser processing operation is obviated such that the organic layer 300 is not exposed to the outside. In addition, by forming both the insulating layer 200 under the organic layer 300 and the encapsulation layer 400 above the insulating layer 200 with an inorganic material as described above, the insulating layer 200 can be attached to (e.g., contacting) the encapsulation layer 400 (refer to FIG. 12B) to thereby reduce or effectively prevent permeation of outside air or moisture to inner layers of the display device 1000.

As mentioned earlier, an island-like hole H may be formed in the organic layer 300 by using each of a plurality of sub-masks 3a and 3b having the above-described shape or by repeatedly using a same one of the sub-mask 3a and 3b a number of times, to form a complete organic layer 300 having the hole H defined thereby.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A method of manufacturing a display device, the method comprising:
    depositing an organic layer on a base substrate of the display device by using one or more deposition mask, wherein the organic layer comprises an organic-luminescent-material area and an organic-luminescent-material-free area which is enclosed by the organic luminescent material area;
    forming an encapsulation layer on the organic layer; and
    forming a penetration hole by removing portions of the base substrate and the encapsulation layer,
    wherein the penetration hole is formed inside the organic-luminescent-material-free area.

2. The method of claim 1, wherein the depositing the organic layer comprises depositing the organic layer through a plurality of sub-masks of the deposition mask.

3. The method of claim 2, wherein each sub-mask of the deposition mask comprises:
    an aperture through which an organic layer material passes through the deposition mask to the base substrate to form less than a total planar area of the organic layer, and
    a masking surface at which the organic layer material does not pass through the deposition mask, the masking surface comprising a hole-forming portion of which a shape thereof is nested within a shape of the aperture.

4. The method of claim 3, wherein the plurality of sub-masks comprises two or three sub-masks.

5. The method of claim 4, wherein
    the plurality of sub-masks comprises a first sub-mask and a second sub-mask,
    the organic-luminescent-material area comprises a first portion of the organic-luminescent-material area which is deposited through the first sub-mask, and a second portion of the organic-luminescent-material area which is deposited through the second sub-mask, and
    a first thickness of the first portion of the organic-luminescent-material area and a second thickness of the second portion of the organic-luminescent-material area are different from each other.

6. The method of claim 5, wherein the first portion of the organic-luminescent-material area and the second portion of the organic-luminescent-material area are not in contact with each other partially.

7. The method of claim 5, wherein the first sub-mask comprises a first aperture shaped as a first fan whose center angle is smaller than 180° and the second sub-mask comprises a second aperture shaped as a second fan whose center angle is greater than 180°.

8. The method of claim 3, wherein the apertures of the plurality of sub-masks have different shapes, different planar areas, or different shapes and different planar areas from each other.

9. The method of claim 3, wherein each of the sub-masks further comprises:
   a semi-transparent portion surrounded by the masking surface, the aperture and the hole-forming portion thereof, and
   within the semi-transparent portion, a plurality of openings is defined.

10. The method of claim 9, wherein the semi-transparent portions of the sub-masks have a same shape and planar area as each other.

11. The method of claim 10, wherein the depositing the organic layer through the plurality of the sub-mask comprises aligning the sub-masks on the base substrate to dispose the semi-transparent portions of the sub-masks completely overlapping with each other.

12. The method of claim 3, wherein for the sub-masks with which the total planar area of the organic layer and the penetration hole therein are formed, the hole-forming portions of the sub-masks have a same shape and planar area as each other.

13. The method of claim 12, wherein for the sub-masks with which the total planar area of the organic layer is formed, a sum of planar areas of the apertures is equal to the total planar area of the organic layer.

14. The method of claim 3, wherein the total planar area of the organic layer is a product of a total planar area of the aperture of the sub-mask and the plurality of the sub-mask through which the organic layer material is provided to the base substrate.

15. The method of claim 3, wherein the depositing the organic layer through the plurality of the sub-masks comprises aligning the sub-masks on the base substrate to dispose the apertures of the sub-masks non-overlapping with each other.

16. The method of claim 3, wherein the depositing the organic layer through the plurality of the sub-masks comprises aligning the sub-masks on the base substrate to dispose the hole-forming portions of the sub-masks completely overlapping with each other.

17. The method of claim 3, wherein the organic-luminescent-material-free area corresponds to the hole-forming portion of the sub-mask in shape and total planar area.

18. The method of claim 1, further comprising providing an insulating layer between the base substrate and the organic layer,
   wherein
   the insulating layer and the encapsulation layer comprise an inorganic material, and
   the removing the portions of the base substrate, the organic layer and the encapsulation layer further removes a portion of the insulating layer between the base substrate and the organic layer, at a position corresponding to the penetration hole.

19. The method of claim 1, wherein in the forming the penetration hole, the portions of the base substrate and the encapsulation layer are removed by using a laser.

20. The method of claim 19, wherein in the forming the penetration hole, the organic layer is not removed by using the laser.

* * * * *